US012677471B2

(12) United States Patent
Young et al.

(10) Patent No.: US 12,677,471 B2
(45) Date of Patent: Jul. 7, 2026

(54) ENHANCED POWER AND SIGNAL FOR STACKED-FETS

(71) Applicant: International Business Machines Corporation, Armonk, NY (US)

(72) Inventors: Albert M. Young, Fishkill, NY (US); Albert M. Chu, Nashua, NH (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 405 days.

(21) Appl. No.: 17/846,423

(22) Filed: Jun. 22, 2022

(65) Prior Publication Data

US 2023/0420303 A1    Dec. 28, 2023

(51) Int. Cl.
| | | |
|---|---|---|
| *H10D 84/03* | (2025.01) |
| *H10D 84/01* | (2026.01) |
| *H10D 88/00* | (2026.01) |
| *H10W 20/20* | (2026.01) |
| *H10W 20/41* | (2026.01) |
| *H10W 20/42* | (2026.01) |
| *H10W 90/00* | (2026.01) |

(52) U.S. Cl.
CPC ....... *H10D 84/038* (2025.01); *H10D 84/0167* (2025.01); *H10D 84/0186* (2025.01); *H10D 88/00* (2025.01); *H10W 20/20* (2026.01); *H10W 20/42* (2026.01); *H10W 20/427* (2026.01); *H10W 90/00* (2026.01)

(58) Field of Classification Search
CPC ............. H10D 84/038; H10D 84/0167; H10D 84/0186; H10D 88/00; H01L 23/481; H01L 23/5226; H01L 23/5286; H01L 25/0657; H10W 20/20; H10W 20/42; H10W 20/427
See application file for complete search history.

(56) References Cited

U.S. PATENT DOCUMENTS

| | | | |
|---|---|---|---|
| 5,619,420 | A | 4/1997 | Breid |
| 7,989,963 | B2 | 8/2011 | Tam |
| 10,741,449 | B2 | 8/2020 | Cheng et al. |
| 11,075,195 | B2 | 7/2021 | Wang et al. |
| 11,127,819 | B2 | 9/2021 | Liaw |
| 2019/0148376 | A1* | 5/2019 | Chanemougame ..........................  H10D 30/6219 257/532 |
| 2020/0211905 | A1* | 7/2020 | Huang ............... H10D 84/0177 |
| 2020/0295003 | A1 | 9/2020 | Dewey et al. |
| 2021/0335710 | A1* | 10/2021 | Cobb .................. H01L 23/5286 |

OTHER PUBLICATIONS

No Author. "TechInsights Platform", retrieved from web https://library.techinsights.com/home, last updated in Nov. 19, 2025, 5 pages.

* cited by examiner

*Primary Examiner* — Tracie Y Green

(74) *Attorney, Agent, or Firm* — Scully, Scott, Murphy & Presser, P.C.; Samuel Waldbaum

(57) ABSTRACT

A semiconductor structure including a reliable power rail in stacked field effect transistor technology with unequal device footprints is provided that mitigates, and in some cases even eliminates, shorting risks that are typically associated using long bars in advanced logic applications.

19 Claims, 3 Drawing Sheets

ENHANCED POWER AND SIGNAL FOR STACKED-FETS

BACKGROUND

The present application relates to semiconductor technology, and more particularly to a semiconductor structure containing a stacked field effect transistor (FET) having a stepped gate and a top FET having a different device footprint than a bottom FET.

Semiconductor technology development requires ongoing advances in area-scaling, leading to more and more transistors fabricated per semiconductor wafer footprint. One way to achieve continued area-scaling for the future semiconductor roadmap is to use physically stacked transistors (i.e., stacked FETs) to achieve the same logic function in a given footprint. This could be achieved, for example, by fabricating a p-type FET on top of an n-type FET (or vice versa) in a so-called standard cell. Although active device widths of the top and bottom FETs can be easily matched, another alternative is to have distinct active device widths for top and bottom FET devices. As one example, the top FET device could be smaller than the bottom FET device to allow more space for wires from above to reach the bottom FET device. Reliable power rails for stacked FET technology is needed.

SUMMARY

A semiconductor structure including a reliable power rail in stacked field effect transistor technology with unequal device footprints is provided that mitigates, and in some cases even eliminates, shorting risks that are typically associated using long bars in advanced logic applications.

In one aspect of the present application, a semiconductor structure is provided. In one embodiment of the present application, the semiconductor structure includes a stacked field effect transistor having a top field effect transistor located above a bottom field effect transistor. The bottom field effect transistor has a first channel region having a first channel width and the top field effect transistor has a second channel region having a second channel width that is different from the first channel width, and the first channel region of the bottom field effect transistor and the second channel region of the top field effect transistor share a common sidewall. The semiconductor structure further includes a first contact structure contacting a source/drain region of the bottom field effect transistor and extending laterally away from the common sidewall, and a power rail in electrical contact with the first contact structure.

In some embodiments of the present application, the first channel width is wider than the second channel width. In such an embodiment, the power rail extends downward from a power source that is located above the top field effect transistor.

In other embodiments of the present application, the first channel width is narrower than the second channel width. In such an embodiment, the power rail extends upward from a power source that is located beneath the bottom field effect transistor.

DETAILED DESCRIPTION

Figure 1A:
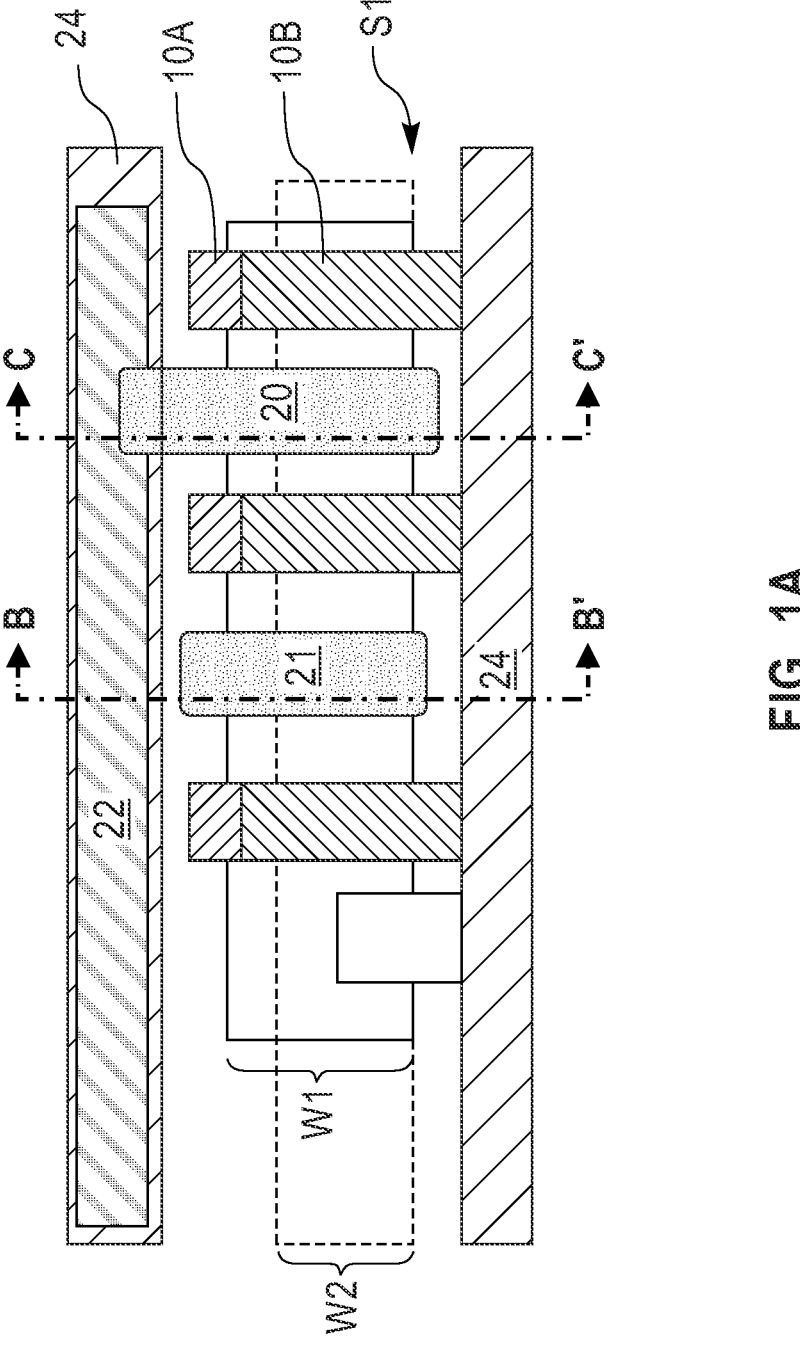
FIG. 1A is a top down view of an exemplary semiconductor structure in accordance with an embodiment of the present application, included within FIG. 1A are Cuts B-B' and C-C' that will be used in the present application to describe various cross sectional views of this exemplary semiconductor structure of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Advanced technologies have small standard-cell heights, and this leads to small wires used to deliver power to the active devices. If the size of these wires become too small, significant voltage drop (IR-drop) occurs along the path to the device, which can lead to circuit failure. This can be alleviated by strengthening the size of the wires used to deliver power, but as standard-cell sizes shrink, the space that can be allocated to such power delivery is at a premium.

In the prior art, the vias below MO (i.e., base metal layer) can be converted to long bars, to help strengthen the power rail and reduce voltage drop. However, for advanced logic, such a bar cannot easily be extended too far down in the z-dimension because of potential reliability and shorting risk to nearby gate metal. There is thus on ongoing need to solve this problem.

The present application provides a reliable power rail in a stacked field effect transistor including top and bottom field effect transistors with unequal device footprints that mitigates, and in some cases even eliminates, shorting risks that are typically associated using long bars in advanced logic applications. In embodiments in which the footprint of the top field effect transistor is narrower than the footprint of the bottom field effect transistor, the power rail can extend downward from a front side power source. In embodiments in which the footprint of the top field effect transistor is wider than the footprint of the bottom field effect transistor, the power rail can extend upward from a backside power source.

Figure 1C:
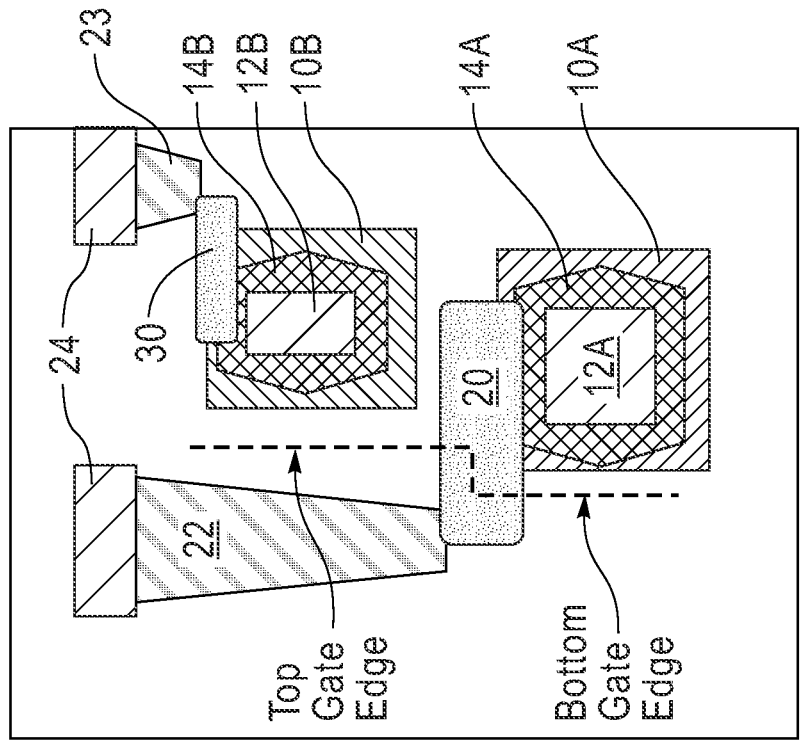
FIG. 1C is a cross sectional view of the exemplary semiconductor structure through C-C' shown in FIG. 1A.
Figure 1B:
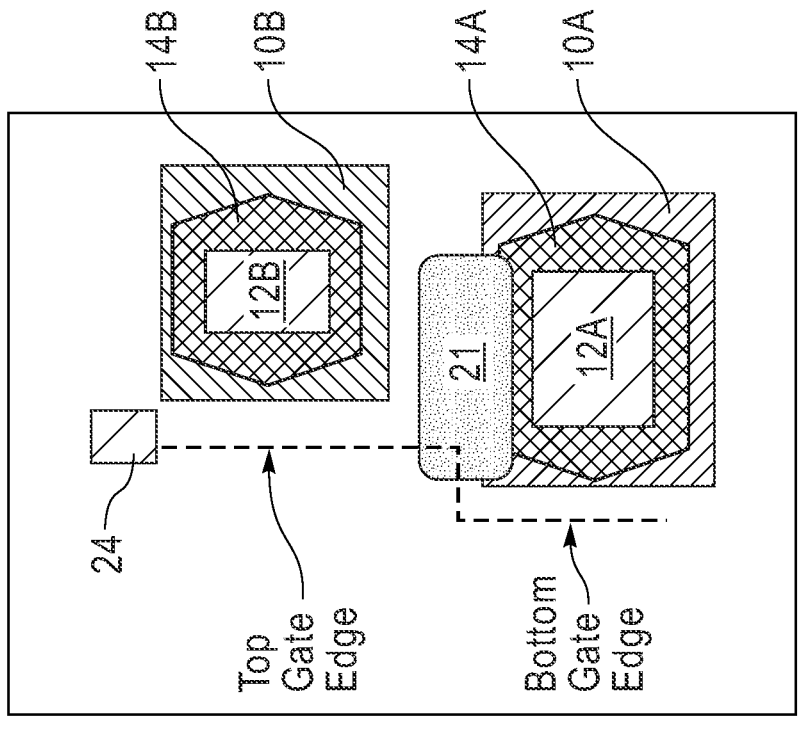
FIG. 1B is a cross sectional view of the exemplary semiconductor structure through B-B' shown in FIG. 1A.

Notably, the semiconductor structure, which is shown, for example, in FIGS. 1A, 1B and 1C, includes a stacked field effect transistor having a top field effect transistor 10B located above a bottom field effect transistor 10A. The bottom field effect transistor 10A has a first channel region 12A having a first channel width, W1, and the top field effect transistor 10B has a second channel region 12B having a second channel width, W2, that is different from the first channel width W1. In the semiconductor structure of the present application, and as shown for example, in FIG. 1A, the first channel region 12A of the bottom field effect transistor 10A and the second channel region 12B of the top field effect transistor 10B share a common sidewall S1. The semiconductor structure further includes a first contact structure 20 contacting a source/drain region 14A of the bottom field effect transistor 10A and extending laterally away from the common sidewall S1; first contact structure 20 can be referred to as a bottom source/drain contact structure. The semiconductor structure further includes a power rail 22 in electrical contact with the first contact structure 20.

The term "stacked field effect transistor (FET)" is used throughout the present application to denote two FETs vertically stacked one atop the other. In the present application and as is illustrated in FIGS. 1A, 1B and 1C, the top field effect transistor 10B is vertically stacked above the bottom field effect transistor 10A. FIGS. 1A, 1B and 1C illustrate one embodiment of the present application in which three laterally stacked transistors are present. In one embodiment of the present application, the top field effect transistor 10B is a p-type field effect transistor and the bottom field effect transistor 10A is an n-type field effect transistor. In another embodiment of the present application, the top field effect transistor 10B is an n-type field effect transistor and the bottom field effect transistor 10A is p-type field effect transistor. In yet other embodiments, the top field effect transistor 10B and the bottom field effect transistor 10A are both n-type field effect transistors, or the top field effect transistor 10B and the bottom field effect transistor 10A are both p-type field effect transistors. The term "p-type field effect transistor, or pFET for short" is used throughout the present application to denote a type of FET in which the channel region of the FET is composed of a majority of holes as current carrier. When the FET is activated and is on, the majority of the current flowing are holes moving through the channel region. The term "p-type field effect transistor, or pFET for short" is used throughout the present application to denote a type of FET in which the channel region of the FET is composed of a majority of electrons as current carrier. When the FET is activated and is on, the majority of the current flowing are electrons moving through the channel region.

The term "field effect transistor, or FET for short" is used throughout the present application to denote a type of transistor that uses an electrical field to control the flow of current in a semiconductor material. FETs are devices with at least three terminals; a source region, a gate electrode, and a drain region. FETs control the flow of current by the application of a voltage to the gate electrode, which in turn alters the conductivity between the drain source and the source region. The source region and the drain region of the FET are separated by a channel region that lies beneath the gate electrode. A gate dielectric material is present between the channel region and the gate electrode. In the present application, the drawings illustrate the channel region of each of the transistors; the gate dielectric material and gate electrode of each of the field effect transistors are not shown for clarity. However, one skilled in the art can readily discern from those drawings that the gate dielectric material and the gate electrode would be located on the channel region.

The channel region of the FET (i.e., the first channel region 12A and the second channel region 12B) is composed of a semiconductor material that has semiconducting properties (i.e., a semiconductor material). Illustrative examples of semiconductor materials that can be used in providing the channel region (i.e., the first channel region 12A and the second channel region 12B) include, but are not limited to, silicon (Si), germanium (Ge). a silicon germanium (Site) alloy, silicon carbide (SiC), silicon germanium carbide (Si-GeC), a 111-V compound semiconductor or an II-VI compound semiconductor. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

In embodiments, the channel region (i.e., the first channel region 12A and the second channel region 12B) can be contained within a semiconductor material structure such as, for example, a semiconductor nanosheet, a semiconductor fin, or a semiconductor nanowire. In embodiments, the channel region (i.e., the first channel region 12A and the second channel region 12B) of each of field effect transistors (i.e., the bottom field effect transistor 10A and the top field effect transistor 10B) is located within a same type of semiconductor material structure, i.e., semiconductor nanosheet, while in other embodiments, the first channel region 12A of the bottom field effect transistor 10A is a first semiconductor material structure (i.e., semiconductor nanosheet or semiconductor fin), while the second channel region 12BA of the top field effect transistor 10B is a second semiconductor material structure (i.e., semiconductor nanosheet or semiconductor fin) that is different from the first semiconductor material structure.

The source region and the drain region (herein referred to as source/drain (SID) region 14A, 14B) of each of the field effect transistors 10A, 10B are composed of a semiconductor material that contains an n-type dopant or a p-type dopant. In the illustrated embodiment, source/drain region 14A is associated with the bottom field effect transistor 10A, while source/drain region 14B is associated with the top field effect transistor 10B. The semiconductor material that provides each of the source/drain regions 14A 14B includes one of the semiconductor materials mentioned above for the first channel region 12A and the second channel region 12B. In some embodiments, the semiconductor material that provides the source/drain regions 14A, 14B can be a compositionally same semiconductor material as the semiconductor material that provides the first channel region 12A and the second channel region 129. For example, silicon can be used as the semiconductor material for the source/drain region 14A, 14B, and the first channel region 12A and the second channel region 12B. In another example, silicon can be used as the semiconductor material for the first channel region 12A and the second channel region 12B, while a silicon germanium alloy can be used as the semiconductor material for the source/drain regions 14A, 14B. In the present application, the source/drain region 14A of the bottom field effect transistor 10A can be composed of a compositionally same, or compositionally different, semiconductor material than the first channel region 12A. Likewise, the source/drain region 14B of the top field effect transistor 10B can be composed of a compositionally same, or compositionally different, semiconductor material than the second channel region 129.

The term "p-type" refers to the addition of impurities to an intrinsic semiconductor material that creates deficiencies of valence electrons. In a silicon-containing semiconductor material, examples of p-type dopants, i.e., impurities, include, but are not limited to, boron, aluminum, gallium and indium. The term "n-type" refers to the addition of impurities that contributes free electrons to an intrinsic semiconductor material. In a silicon containing semiconductor material, examples of n-type dopants, i.e., impurities, include, but are not limited to, antimony, arsenic and phosphorous. The n-type dopant or p-type dopant are typically present in the semiconductor material that provides the source region or drain region in a concentration of from $5 \times 10^{18}$ atoms/cm 3 to $1.5 \times 10^{21}$ atoms/cm 3.

The gate dielectric material of the bottom field effect transistor 10A and the top field effect transistor 10B can be composed of a dielectric material such as, for example, an oxide, nitride, and/or oxynitride. In one example, the gate dielectric material can be composed of a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric material. In the present application, the gate dielectric material of the bottom field effect transistor 10A can be compositionally the same as, or compositionally different from, the gate dielectric material of the top field effect transistor 10B.

The gate electrode of the bottom field effect transistor 10A and the top field effect transistor 10B includes a gate conductor material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In the present application, the gate electrode of the bottom field effect transistor 10A can be compositionally the same as, or compositionally different from, the gate electrode of the top field effect transistor 10B.

The term "power rail" is used throughout the present application to denote a structure that is configured to deliver power from a power source to the stacked field effect transistors. In the drawings of the present application, the power rail is labeled as element 22. The power rail 22 is composed of any electrically conductive power rail material including, but not limited to, tungsten (W), cobalt (Co), ruthenium (Ru), aluminum (Al), copper (Cu), platinum (Pt), rhodium (Rh), or palladium (Pd).

Figure 2:
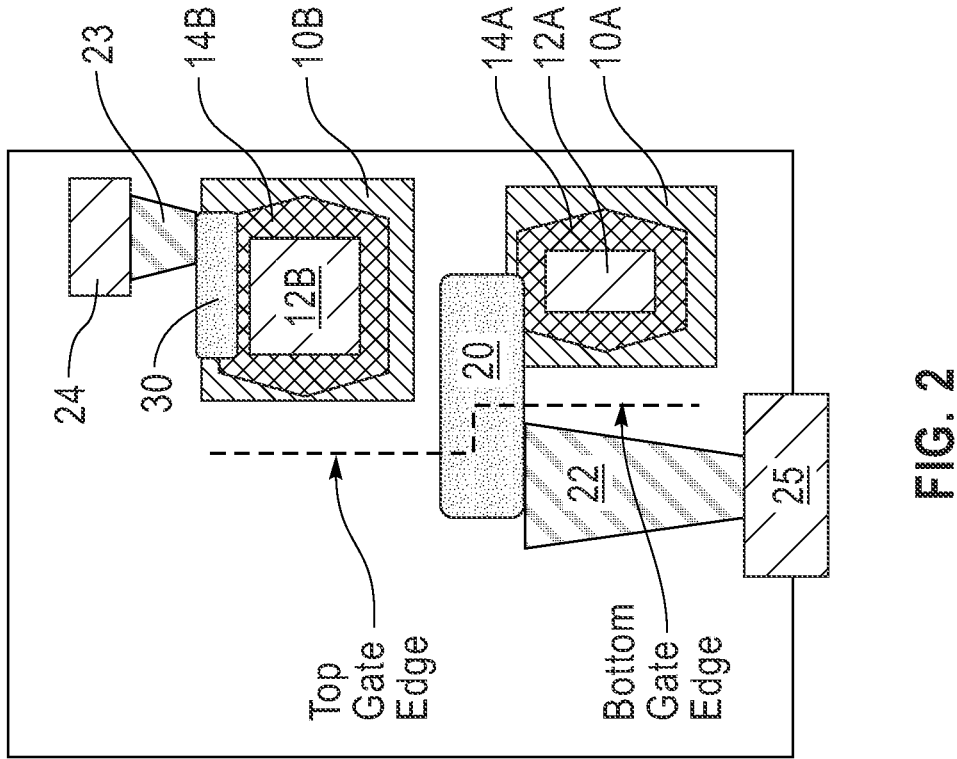
FIG. 2 is a cross sectional view of another exemplary semiconductor structure of the present application illustrating an embodiment in which the power rail extends upward from a power source that is located beneath the bottom field effect transistor of a stacked field effect transistor.

The term "power source" is used throughout the present application to denote an electrically conductive metal-containing layer that can be used to generate power. The power source can be arranged as individual strips (or bars) that run parallel to each other. In some embodiments, and as is illustrated in FIGS. 1A, 1B and 1C, the power source is a front side power source 24 that is located above the top field effect transistor 10B. In such an embodiment, at least one of the front side power sources 24 is in electrical contact with the power rail 22 that is in contact with the source/drain region 14A of the bottom field effect transistor 10A and the via structure 23 (to be described herein below) which is in contact with the source/drain region 12B of the top field effect transistor 10B. In other embodiments, and as is illustrated in FIG. 2, the power source is a back side power source 25 that is located beneath the bottom field effect transistor 10A. In this embodiment, the back side power source 25 is in electrical contact with the power rail 22 that is in contact with the source/drain region 14A of the bottom field effect transistor 10A. In embodiments, a top power source 24 and a bottom power source 25 can be both present as shown in FIG. 2.

The term "contact structure" is used throughout the present application to denote an electrically conductive structure that is in electrical contact with the S/D region of one of the field effect transistors. In the present application, the first contact structure 20 (or bottom source/drain contact structure) contacts the source/drain region 14A of the bottom field effect transistor 10A as well as the power rail 22. The second contact structure 30 (which can be referred to as a top source/drain contact structure) contacts the source/drain region 14B of the top field effect transistor 10B. In embodiments, a via structure 23 can be present between the top power source 24 and the second contact structure 30. Each contact structure (i.e., the first contact structure 20 and the second contact structure 30) is composed of an electrically conductive metal or an electrically conductive metal alloy. Illustrative examples of electrically conductive metals that can be used in the present application to provide the skip-level through-silicon via structure contact include, but are not limited to, copper (Cu), aluminum (Al), tungsten (W), ruthenium (Ru), or cobalt (Co). Illustrative examples of electrically conductive metal alloys that can be used in the present application to provide the contact structure include, but are not limited to, a Cu—Al alloy, a Cu—W alloy, or Ru—Co alloy. Via structure 23 can also be composed of one of the electrically conductive metals or electrically conductive metal alloys mentioned above.

As mentioned above, the bottom field effect transistor 10A has a first channel region 12A having a first channel width, W1, and the top field effect transistor 10B has a second channel region 12B having a second channel width, W2 that is different from the first channel width W1. In some embodiments and as is illustrated in FIGS. 1A, 1B and 1C, the first channel width, W1 is wider than the second channel width, W2. In one example, W1 is about 150 nm, while W2 is about 100 nm; the term "about" denotes that the value of each width, W1 and W2, can be in a range from ±10 nm of the expressed value. When W1 is wider than W2, the stacked field effect transistor has a stair-case configuration. For the front side power source 24 embodiment shown in FIGS. 1A, 1B and 1C, the stair-case stacked field effect transistor configuration provides more space for the power rail 22 to be formed on the frontside of the wafer without impinging on the top field effect transistor 10B.

In other embodiments, and as is illustrated in FIG. 2, the first channel width, W1, is narrower than the second channel width, W2. In one example, W1 is about 100 nm while W2 is about 150 nm; again the term "about" denotes that the value of each width, W1 and W2, can be in a range from ±10 nm of the expressed value. When W1 is narrower than W2, the stacked field effect transistor has an inverse stair-case configuration. For the back side power source 25 embodiment shown in FIG. 2, the inverse stair-case stacked field effect transistor configuration provides more space for the power rail 22 to be formed from the backside of the wafer without impinging on the bottom field effect transistor 10A.

Figure 3:
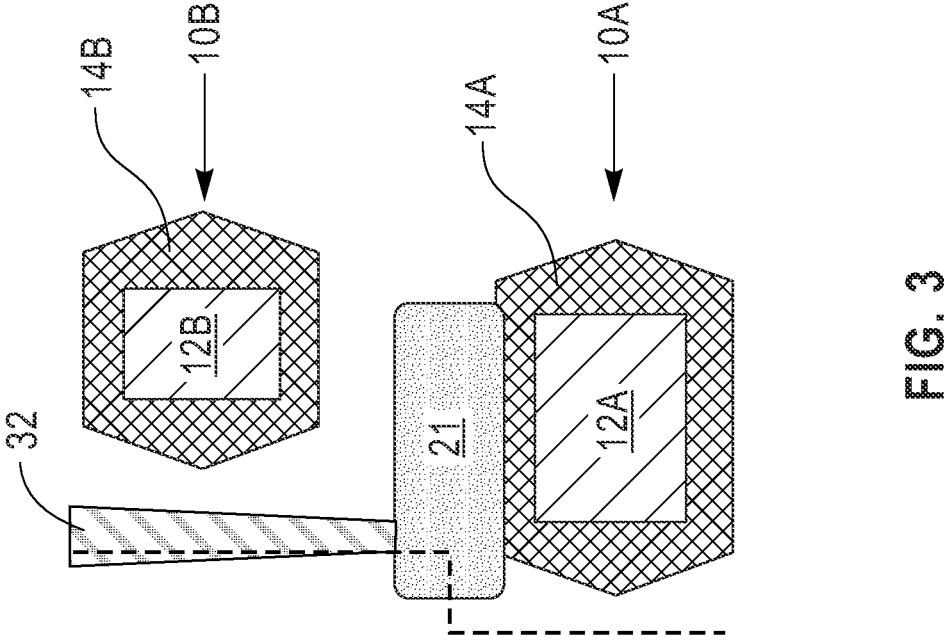
FIG. 3 is a cross sectional showing a single line connection for any of the exemplary semiconductor structures of the present application.

Reference is now made to FIG. 3, which shows a signal line connection for any of the exemplary semiconductor structures of the present application. Notably, FIG. 3 shows a signal line connection for the cross sectional view shown in FIG. 1B. The signal line connection includes a signal line 32 in electrical contact with another first contact structure 21 of a source/drain region 14A of a bottom field effect transistor 10A of an adjacent stacked field effect transistor. The signal line 32 is composed of an electrically conductive metal or electrically conductive metal alloy as mentioned above. The adjacent stacked field effect transistor also includes a top field effect transistor 10B located above the bottom field effect transistor 10A.

Although not shown, the stacked FET 10A, 10B and the power rail 22, power sources 24, contact structures 20, 30 can be embedded within an interlayer dielectric material such as, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide.

The semiconductor structure of the present application can be formed utilizing conventional stacked FET processing flows with the addition of cutting one of the FETs such that the top and bottom FETs of a stacked field effect transistor have different device footprints (i.e., the channel widths are different). The cutting can include lithography and etching. The power rail 22, power sources 24, 25, contact structures 20, 30 can be formed utilizing techniques that are well known to those skilled in the art. For example, the power rail 22, power sources 24, 25, contact structures 20, 30 and can be formed by forming an opening (via lithography and etching) in the interlayer dielectric material, filling the opening with an appropriate material that provides one of the power rail 22, power sources 24, 25, contact structures 20, 30, and the removing the deposited material that is formed outside of the opening formed in the interlayer dielectric material by planarization or other like material removal process. The signal line 32 can be formed utilizing a similar process as that used in forming the power rail 22, power sources 24, 25, contact structures 20, 30.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a stacked field effect transistor having a top field effect transistor located above a bottom field effect transistor, wherein the bottom field effect transistor has a first channel region having a first channel width and the top field effect transistor has a second channel region having a second channel width that is different from the first channel width, and wherein the first channel region of the bottom field effect transistor and the second channel region of the top field effect transistor share a common sidewall;
a first contact structure directly contacting a top surface of a source/drain region of the bottom field effect transistor and extending laterally away from the common sidewall and beyond a sidewall of the source/drain region of bottom field effect transistor; and
a power rail in electrical contact with the first contact structure.

2. The semiconductor structure of claim 1, wherein the first channel width is wider than the second channel width.

3. The semiconductor structure of claim 2, wherein the top field effect transistor is a p-type field effect transistor and the bottom field effect transistor is an n-type field effect transistor.

4. The semiconductor structure of claim 2, wherein the top field effect transistor is an n-type field effect transistor and the bottom field effect transistor is p-type field effect transistor.

5. The semiconductor structure of claim 2, wherein the top field effect transistor and the bottom field effect transistor are both n-type field effect transistors.

6. The semiconductor structure of claim 2, wherein the top field effect transistor and the bottom field effect transistor are both p-type field effect transistors.

7. The semiconductor structure of claim 2, wherein the power rail extends downward from a power source that is located above the top field effect transistor.

8. The semiconductor structure of claim 2, further comprising a single line in electrical contact with another first contact structure of a source/drain region of a bottom field effect transistor of an adjacent stacked field effect transistor.

9. The semiconductor structure of claim 2, further comprising a second contact structure contacting a source/drain region of the top field effect transistor.

10. The semiconductor structure of claim 9, wherein the second contact structure is connected to a power source that is located above the top field effect transistor by a via structure.

11. The semiconductor structure of claim 1, wherein the first channel width is narrower than the second channel width.

12. The semiconductor structure of claim 11, wherein the top field effect transistor is a p-type field effect transistor and the bottom field effect transistor is an n-type field effect transistor.

13. The semiconductor structure of claim 11, wherein the top field effect transistor is an n-type field effect transistor and the bottom field effect transistor is p-type field effect transistor.

14. The semiconductor structure of claim 11, wherein the top field effect transistor and the bottom field effect transistor are both n-type field effect transistors.

15. The semiconductor structure of claim 11, wherein the top field effect transistor and the bottom field effect transistor are both p-type field effect transistors.

16. The semiconductor structure of claim 11, wherein the power rail extends upward from a power source that is located beneath the bottom field effect transistor.

17. The semiconductor structure of claim 11, further comprising a single line in electrical contact with another first contact structure of a source/drain region of a bottom field effect transistor of an adjacent stacked field effect transistor.

18. The semiconductor structure of claim 11, further comprising a second contact structure contacting a source/drain region of the top field effect transistor.

19. The semiconductor structure of claim 18, wherein the second contact structure is connected to a power source that is located above the top field effect transistor by a via structure.

\* \* \* \* \*